(12) United States Patent
Hajati et al.

(10) Patent No.: US 9,604,255 B2
(45) Date of Patent: Mar. 28, 2017

(54) METHOD, APPARATUS AND SYSTEM FOR A TRANSFERABLE MICROMACHINED PIEZOELECTRIC TRANSDUCER ARRAY

(71) Applicants: Arman Hajati, Santa Clara, CA (US); Ut Tran, San Jose, CA (US); Darren Todd Imai, Los Gatos, CA (US); Martin Schoeppler, Santa Clara, CA (US)

(72) Inventors: Arman Hajati, Santa Clara, CA (US); Ut Tran, San Jose, CA (US); Darren Todd Imai, Los Gatos, CA (US); Martin Schoeppler, Santa Clara, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 302 days.

(21) Appl. No.: 14/152,899

(22) Filed: Jan. 10, 2014

(65) Prior Publication Data
US 2015/0200350 A1 Jul. 16, 2015

(51) Int. Cl.
H01L 41/33 (2013.01)
B06B 1/06 (2006.01)
H01L 41/09 (2006.01)
H01L 41/313 (2013.01)
H01L 41/331 (2013.01)

(52) U.S. Cl.
CPC .......... *B06B 1/0622* (2013.01); *B06B 1/0688* (2013.01); *H01L 41/098* (2013.01); *H01L 41/313* (2013.01); *H01L 41/331* (2013.01); Y10T 29/42 (2015.01)

(58) Field of Classification Search
CPC ..... H04R 17/00; B06B 1/0622; B06B 1/0603; B06B 1/0688; B06B 3/00; G10K 11/02; B08B 7/026
USPC .................................................. 310/322, 334
See application file for complete search history.

(56) References Cited

U.S. PATENT DOCUMENTS

| 2005/0156491 A1* | 7/2005 | Scott ...................... B06B 1/064 310/334 |
| 2005/0203409 A1 | 9/2005 | Frey et al. |
| 2006/0238067 A1 | 10/2006 | Dausch |

(Continued)

OTHER PUBLICATIONS

International Preliminary Report on Patentability PCT Application No. PCT/US2014/054779 mailed Jul. 12, 2016, 7 pages.

(Continued)

*Primary Examiner* — Shawki S Ismail
*Assistant Examiner* — Bryan Gordon
(74) *Attorney, Agent, or Firm* — Blakely, Sokoloff, Taylor & Zafman LLP

(57) ABSTRACT

Techniques and mechanisms to provide mechanical support for a micromachined piezoelectric transducer array. In an embodiment, a transducer array includes transducer elements each comprising a respective membrane portion and a respective supporting structure disposed on or around a periphery of that membrane portion. The transducer elements are initially formed on a sacrificial wafer, wherein supporting structures of the transducer elements facilitate subsequent removal of the sacrificial wafer and/or subsequent handling of the transducer elements. In another embodiment, a polymer layer is disposed on the transducer elements to provide for flexible support during such subsequent handling.

9 Claims, 10 Drawing Sheets

(56) References Cited

U.S. PATENT DOCUMENTS

| | | | | |
|---|---|---|---|---|
| 2009/0082673 A1* | 3/2009 | Lu | ................... | A61B 8/4281 |
| | | | | 600/459 |
| 2009/0140606 A1* | 6/2009 | Huang | ................ | B06B 1/0292 |
| | | | | 310/322 |
| 2010/0096710 A1* | 4/2010 | Chou | ................ | G06K 9/0002 |
| | | | | 257/414 |
| 2011/0316387 A1* | 12/2011 | Togasaki | ............. | B06B 1/0622 |
| | | | | 310/334 |
| 2012/0206014 A1* | 8/2012 | Bibl | ................. | B06B 1/0644 |
| | | | | 310/331 |
| 2013/0096413 A1 | 4/2013 | Ashkenazi et al. | | |
| 2013/0294201 A1* | 11/2013 | Hajati | ................ | H01L 41/047 |
| | | | | 367/138 |

OTHER PUBLICATIONS

"International Search Report and Written Opinion of the International Searching Authority dated Jan. 12, 2015, in International Patent Application No. PCT/US2014/054779, 10 pages".

* cited by examiner

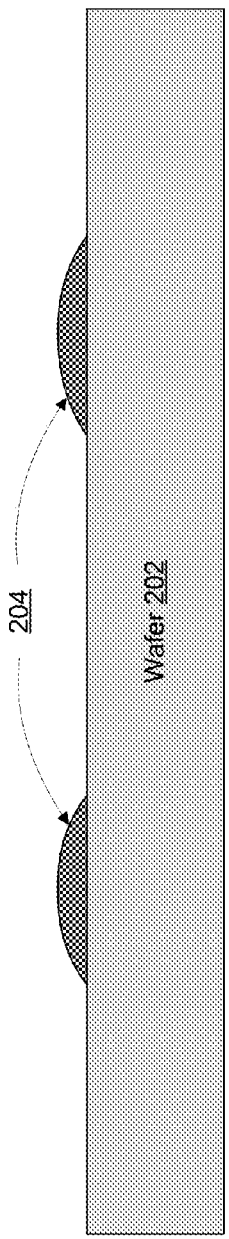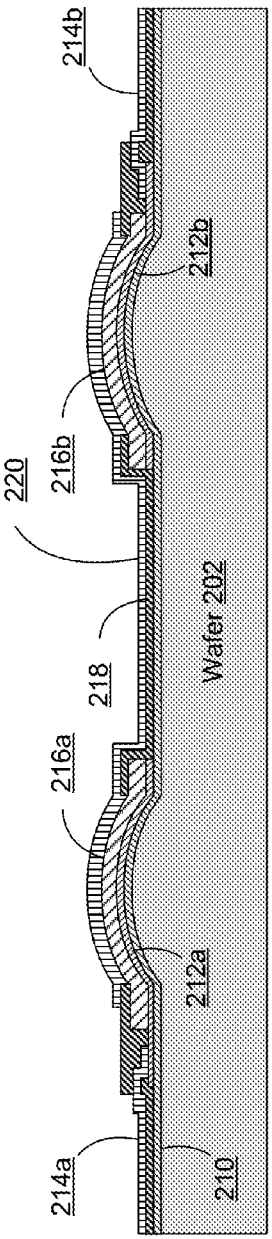

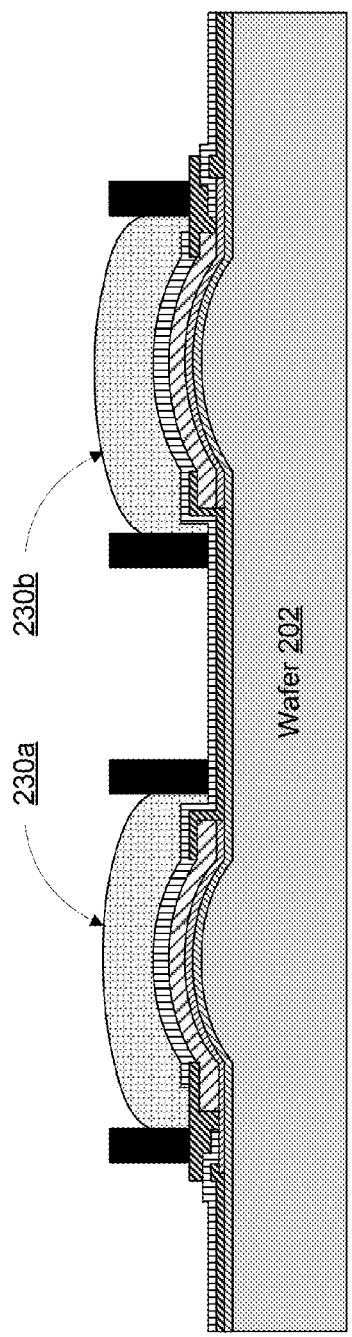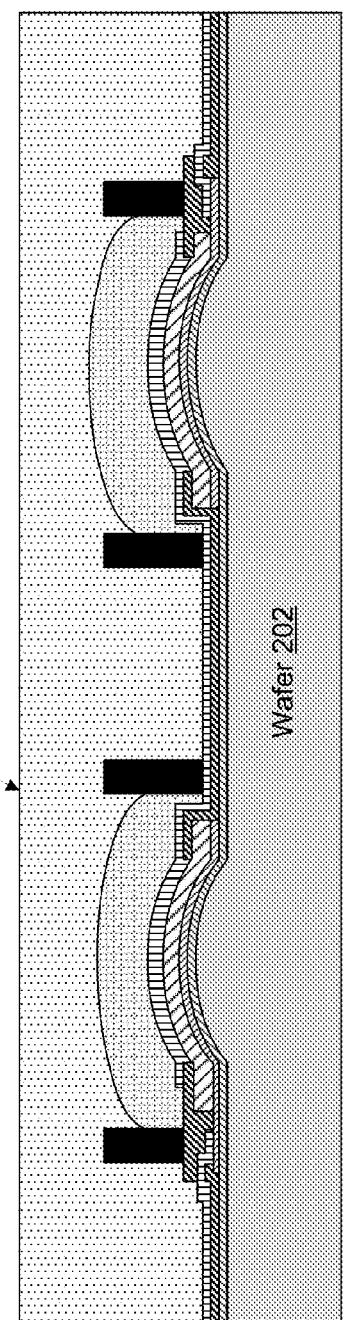

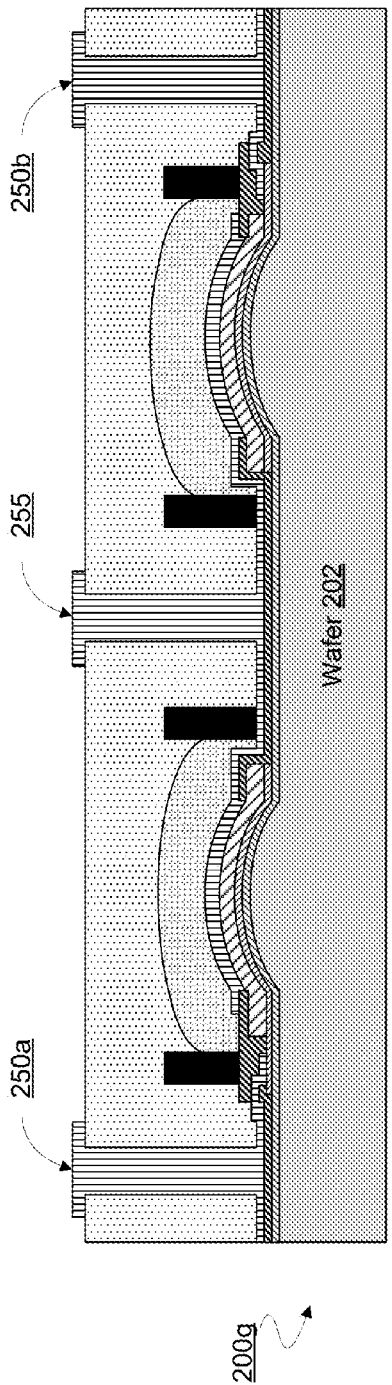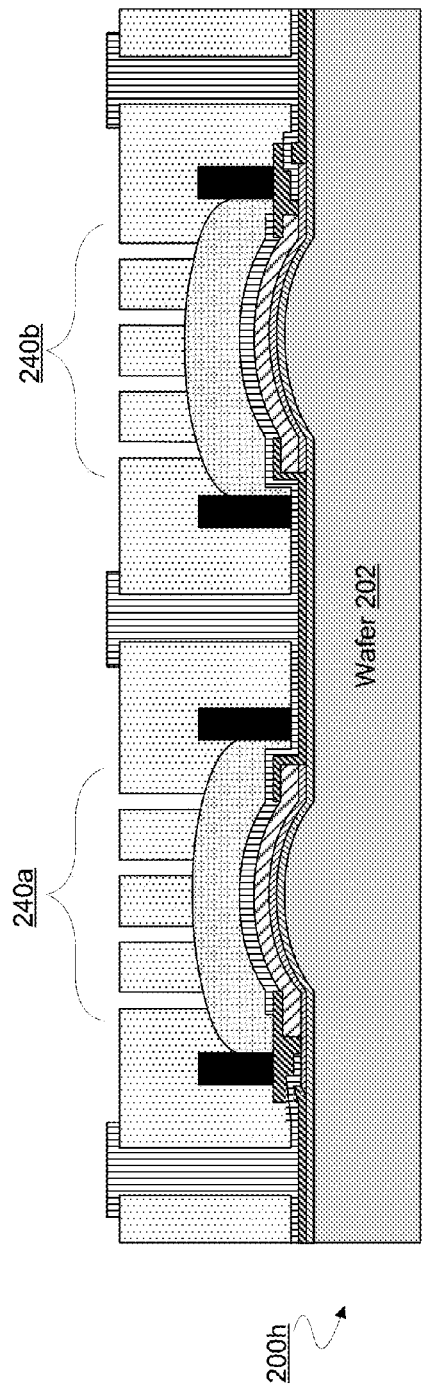

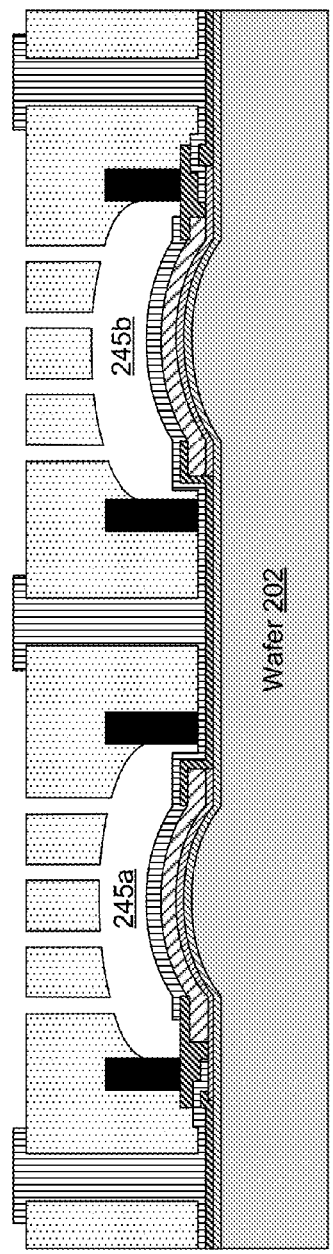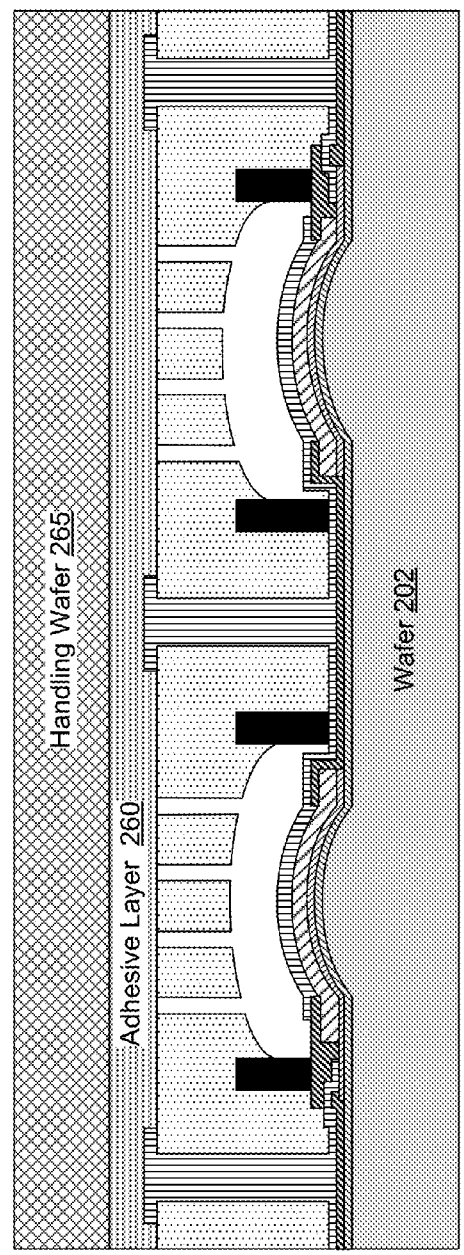

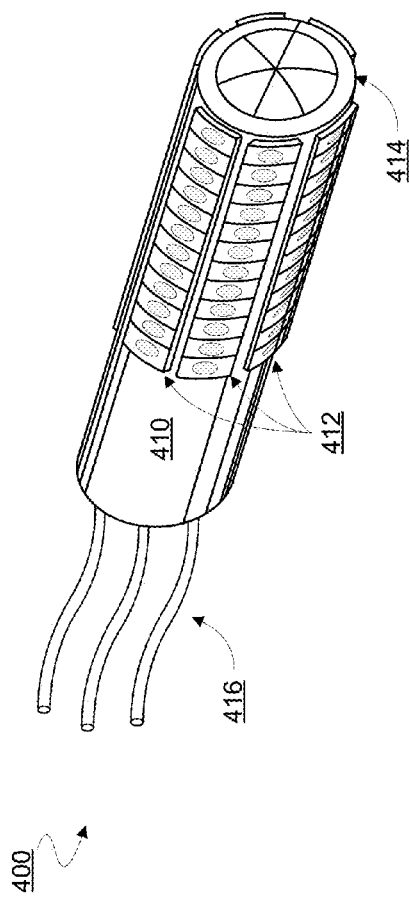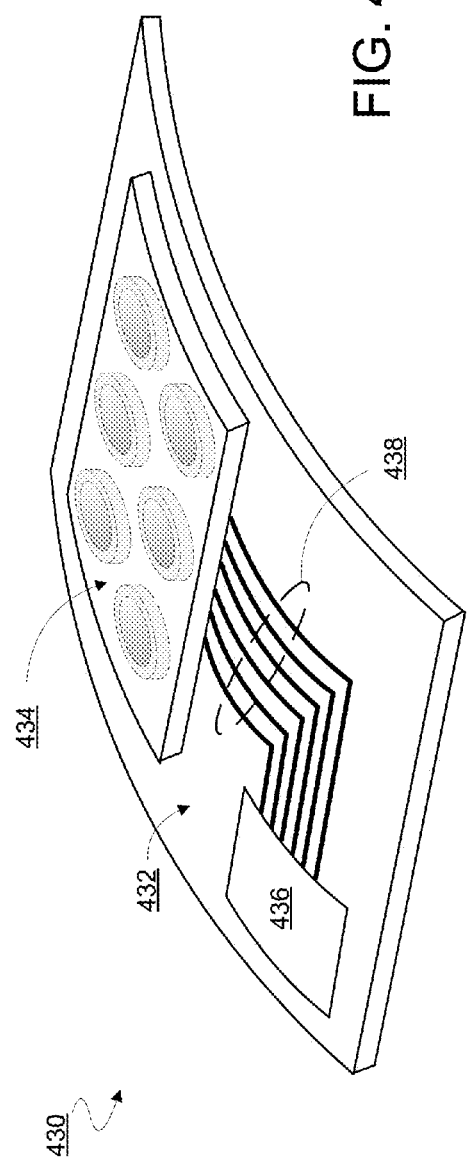

METHOD, APPARATUS AND SYSTEM FOR A TRANSFERABLE MICROMACHINED PIEZOELECTRIC TRANSDUCER ARRAY

BACKGROUND

1. Technical Field

Embodiments of the invention generally relate to micromachined transducer arrays, and more particularly, but not exclusively, pertain to techniques for wafer level fabrication of such arrays.

2. Background Art

A piezoelectric transducer includes a piezoelectric element capable of converting electrical energy into mechanical energy (e.g., motion, sound or ultrasound energy), and vice versa. Thus, a piezoelectric transducer can serve both as a transmitter of mechanical energy and a sensor of impinging mechanical energy. A piezoelectric element can be used as an actuator, inkjet membrane, ultrasound transducer, sensor (e.g. accelerometer, gyro, pressure sensor, etc.) or other device for energy harvesting, mixing, pumping or any of various other applications.

Transducer devices can be advantageously fabricated inexpensively to exceedingly high dimensional tolerances using various micromachining techniques (e.g., material deposition, lithographic patterning, feature formation by etching, etc.). Such devices include micromachined transducer arrays such as arrays of capacitive transducers and/or piezoelectric transducers, for example. Typically, piezoelectric structures of a transducer array are built on a semiconductor wafer which is subsequently cut into die which are variously incorporated each into a respective device.

BRIEF DESCRIPTION OF THE DRAWINGS

The various embodiments of the present invention are illustrated by way of example, and not by way of limitation, in the figures of the accompanying drawings and in which:

FIGS. 2A through 2L are cross-sectional views which each illustrate elements of a respective stage of a process for fabricating a transducer array according to an embodiment.

FIGS. 4A and 4B illustrate elements of respective devices each including one or more transducers according to a corresponding embodiment.

DETAILED DESCRIPTION

Embodiments discussed herein variously include techniques and/or mechanisms to provide mechanical support for a transducer array. For example, a transducer array according to an embodiment includes one or more transducer elements each comprising a respective membrane portion and a respective supporting structure disposed on or around a periphery of that membrane portion. Some or all of the one or more transducer elements may be initially formed on a sacrificial wafer—e.g. where the supporting structures facilitate subsequent removal of the sacrificial wafer and/or subsequent handling of the one or more transducer elements. Alternatively or in addition, a polymer layer may be disposed on the one or more transducer elements to provide for flexible support during such subsequent handling.

Such support structures may variously facilitate bonding or other assembly of a transferrable and/or conformable transducer array as a die-level module into or on to any of a wide variety of types of materials and structures—e.g. using pick-and-place techniques. Transferability of transducer array from a sacrificial wafer (or die cut from such a wafer) to any of various types of dies, wafers, substrates or other such structures may provide for any of various benefits. Some examples of such benefits include reduced production costs, improved process flexibility, availability of hybrid micro/macro fabrication processes, a wider range of available material choices, improved pre-assembly die-level testing capability, and higher scale integration opportunities.

Figure 1:
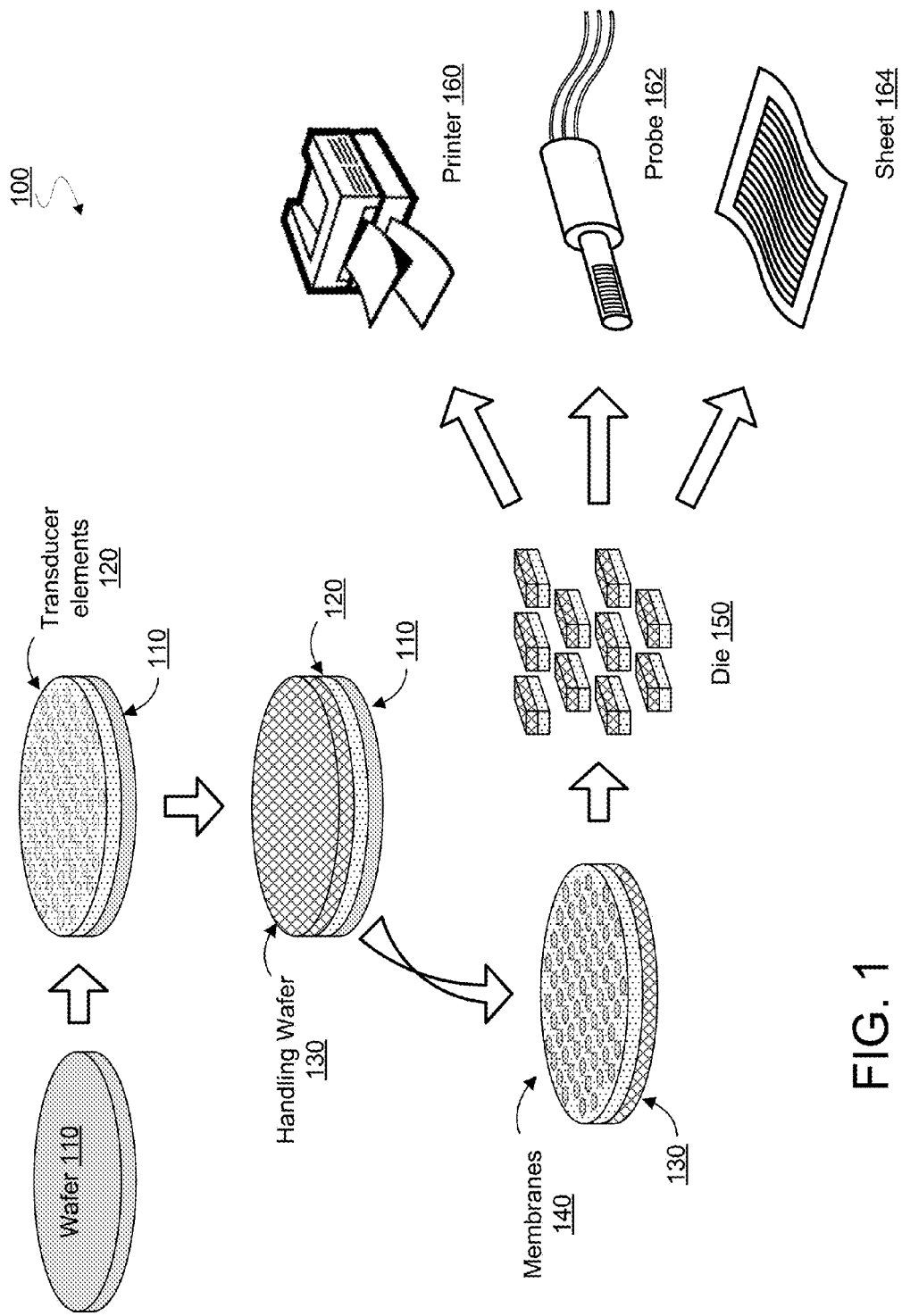
FIG. 1 illustrates a process for providing transducers to be included in one or more devices according to an embodiment.

FIG. 1 illustrates elements of processing 100 to provide transducer elements transferred from a wafer according to an embodiment. During processing 100, a wafer 110—e.g. comprising bulk silicon—may be provided for semiconductor fabrication processes to form transducer structures thereon. Such processes may include the formation of convex microbump and/or concave microbump structures (not shown) on wafer 110. Alternatively or in addition, such processes may include, but are not limited to, lithography, etching, sputtering, plating and/or any of various other additive and/or subtractive processes to variously form transducers components on such microbump structures.

By way of illustration and not limitation, transducer elements 120 formed on wafer 110 may include concave, convex and/or planar membrane structures—e.g. where other structures of transducer elements 120 are to provide flexible support for such membrane structures. Such support may be provided at least in part, for example, with ring-type support elements which are each disposed on or around a periphery of a respective membrane structure. Alternatively or in addition, such support may be provided at least in part with a polymer layer formed over such ring-type support elements and/or one or more membrane structures.

The flexible support provided for transducer elements 120 according to various embodiments may allow for removal of transducer elements 120 from the wafer 110 on which they are originally formed. For example, a handling wafer 130 may be adhered or otherwise bonded to a back side of transducer elements 120. In this context, back side refers to a side opposite to one which includes membrane structures of transducer elements 120. Handling wafer 130 may provide for temporary mechanical support of transducer elements 120 during processing to separate or otherwise remove wafer 110 from transducer elements 120. Such removal of wafer 110 may expose some or all of the membrane structures of transducer elements 120—as represented by the illustrative membranes 140.

After removal of wafer 110, transducer elements 120 may be available for processing to selectively transfer some or all such transducer elements to any of a wide variety of devices. By way of illustration and not limitation, the assembly which includes both handling wafer 130 and transducer elements 120 may be cut into a plurality of die 150. Transducer elements of some or all such die 150 may then be variously incorporated—e.g. according to techniques adapted from conventional pick-and-place processing—each into a respective device (or device component). For example, one or more transducer elements of die 150 may be bonded onto, integrated with or otherwise included in a printhead of a printer 160. Alternatively or in addition, one or more such transducer elements may be similarly incorporated into a probe 162 such as those for any of a variety of medical applications, or onto a flexible sheet 164 which is to serve as any of a variety of flexible MEMs devices.

The flexible support provided according to various embodiments allows for some or all of an array of micromachined piezoelectric transducers to be variously bonded each onto a respective structure which, for example, has not been formed with semiconductor fabrication processing. For example, a transducer element of die 150 may be adhered directly to the body of a printhead, or other such structure, which has been formed by plastic extrusion, plastic injection molding and/or the like. These structures may be the result of processes which are incompatible with forming semiconductor structures—e.g. where such processes, as compared to semiconductor processing, are relatively cheap, hazardous and/or prone to contamination. The flexible support provided according to various embodiments also allows for an array of micro-machined piezoelectric transducers to conform to a curved and/or flexible surface of a device (or device component) to which they are bonded.

FIGS. 2A-2L show cross-sectional views for various stages of a process to fabricate a transducer array according to an embodiment. The processing represented in FIGS. 2A-2L may form one or more of transducer arrays 106, 126, 136, for example. The operations variously represented in FIGS. 2A-2L, and their order in relation to one another, are merely illustrative, and some or all such operations may be variously reordered, removed and/or combined with other processing steps according to different embodiments.

FIG. 2A illustrates a stage 200a of fabrication during which a wafer 202 is prepared for subsequent processing to form in or on wafer 202 various structures of respective transducer elements. In an embodiment, wafer 202 is to serve as a sacrificial (or "donor") wafer which, eventually, is to be separated from transducer element structures formed thereon. Although certain embodiments are not limited in this regard, wafer 202 may include any of various substrate materials known in the art as amenable to microelectronic/micromachining processing. By way of illustration and not limitation, wafer 202 may include a bulk crystalline semiconductor such as silicon, and/or materials of various types of semiconductor wafers. In another embodiment, wafer 202 includes a glass or other such material which is compatible with the processing discussed herein.

Certain embodiments are discussed herein with respect to the fabrication of microdome-type transducer elements which each include convex piezoelectric structures. However, such discussion may be extended to additionally or alternatively apply to any of various other types of transducer elements—e.g. including transducer elements which instead include concave (or even flat) piezoelectric structures. For example, processing at stage 200a may be in preparation for the formation of one or more microbump structures with wafer 202. In an illustrative embodiment, a lithographic mask 204 may be disposed on a surface of wafer 202, wherein a pattern formed by mask 204 selectively allows portions of wafer 202 to be exposed to an etch processing.

Referring now to stage 200b of FIG. 2B, material of wafer 202 remaining after such an etch may be formed into microbumps—e.g. including the illustrative bump structures 206a, 206b—which extend above a surface of wafer 202. Formation of such microbumps may include applying a bump reflow processing to other previously masked portions of wafer 202. Alternatively or in addition, concave indentations may be formed in wafer 202—e.g. rather than the convex bump structures 206a, 206b. Such indentations may be used for building up concave shaped active structures of a transducer element.

Subsequent subtractive and/or additive semiconductor processing techniques (e.g., including one or more of material deposition, lithographic patterning, feature formation by etching, etc.) may be adapted, according to various embodiments, to variously form piezoelectric elements over bump structures 206a, 206b. By way of illustration and not limitation, referring now to stage 200c of FIG. 2C, a cross-sectional view is shown for structures of two adjacent micromachined piezoelectric transducer elements that may be utilized to form an array. In an embodiment, an optional layer 210 of dielectric material may be deposited on the surface of wafer 202 which forms bump structures 206a, 206b. Layer 210 may comprise any of a variety of dielectric materials capable of facilitating a subsequent etch processing for separation or other removal of wafer 202 from transducer element structures formed thereon. By way of illustration and not limitation, layer 210 may comprise SiO2, SiNx or any of a variety of other materials suitable to serve as an etch stop to provide for release of structures formed on wafer 202. Layer 210 may be formed with a plasma-enhanced chemical vapor deposition (PECVD) process, although certain embodiments are not limited in this regard.

As further depicted in stage 200c, bottom electrodes 212a, 212b for respective transducer elements may be disposed on layer 210. Piezoelectric membranes 216a and 216b may be disposed in direct contact with a top surface of the bottom electrodes 212a, 212b, respectively. Bottom electrodes 212a, 212b may each include a thin film layer of conductive material—e.g. deposited by physical vapor deposition (PVD), atomic layer deposition (ALD), chemical vapor deposition (CVD) or the like—that is compatible (e.g., thermally stable, has good adhesion, low stress) with a piezoelectric membrane material, such as, but not limited to, one or more of Au, Pt, Ni, Ir, Sn, etc., alloys thereof (e.g., AuSn, IrTiW, AuTiW, AuNi, etc.), oxides thereof (e.g., IrO2, NiO2, PtO2, indium tin oxide (ITO), etc.), or composite stacks of two or more such materials. In an illustrative embodiment, piezoelectric membranes 216a and 216b include Lead Zirconate Titanate (PZT), although any piezoelectric material known in the art to be amenable to conventional micromachine processing may also be utilized, such as, but not limited to polyvinylidene difluoride (PVDF) polymer particles, BaTiO3, single crystal PMN-PT, and aluminum nitride (AlN).

A thin film dielectric layer 218 (e.g., SiO2, Si3Nx) may be further disposed over portions of the piezoelectric membranes 216a, 216b and, in an embodiment disposed over wafer 202 in regions between the membranes 216a, 216b. Dielectric layer 218 may be formed with PECVD, although certain embodiments are not limited in this regard. As shown, a top electrode metallization 220 may be disposed in direct contact with a top surface of the piezoelectric membranes 216a and 216b. Top electrode metallization 220 may serve to connect one or more terminals of a transducer element (or elements) to a common reference plane potential (e.g., ground) plane. In an embodiment, dielectric layer 218 insulates bottom electrodes 212a, 2121b from respective top electrode metallization 220.

In an embodiment, interconnects 214a, 214b may be electrically connected to bottom electrodes 212a, 2121b, respectively. The interconnects 214a, 214b may each include a thin film layer of conductive material (e.g., deposited by PVD, ALD, CVD, etc.) of any conventional composition capable of providing a low resistance and amenable to patterning, such as, but not limited to, Au, Al, W, or Cu. Top electrode metallization 220 may be employed as the reference (ground) plane to shield one or more transducer elements from electro-magnetic interference and the surface electrical charge in the ambient environment during operation. In such an embodiment, bottom electrodes 212*a*, 2121*b* and interconnects 214*a*, 214*b* may be employed as drive/sense signal terminals.

Figure 2D:
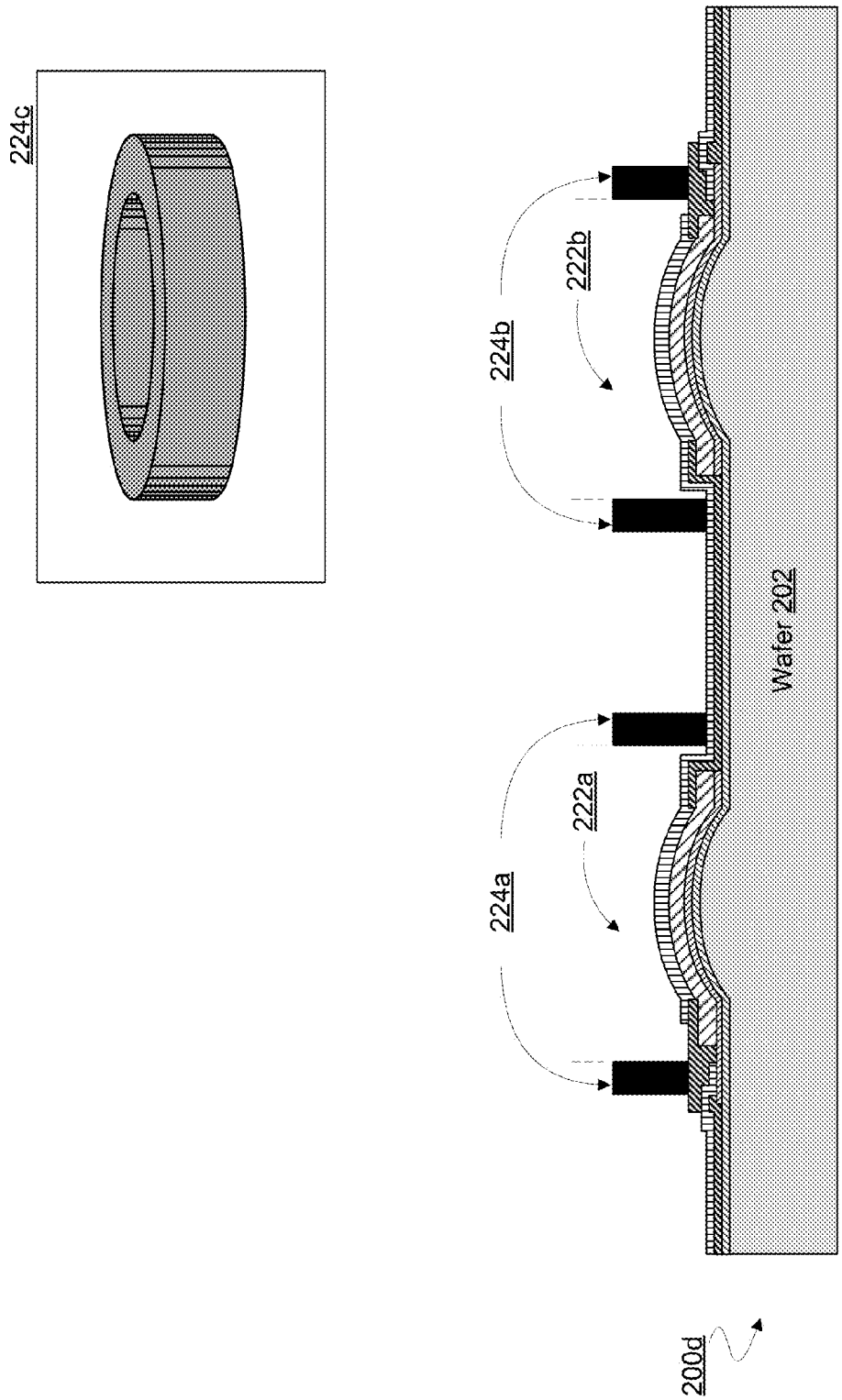

Referring now to FIG. 2D, a stage 200*d* is shown wherein one or more support structures—e.g. including the illustrative support structures 224*a*, 224*b*—are each formed on or around structures of a respective transducer element. By way of illustration and not limitation, plating processing may be employed to build one or both of support structures 224*a*, 224*b* each as a respective reinforcing backbone to provide mechanical strength for a corresponding piezoelectric membrane. For example, copper plating may be performed for structures 224*a*, 224*b* each to have a thickness in range of 3 μm-30 μm. In one embodiment, structures 224*a*, 224*b* each have a thickness of 5 μm.

Features of support structures 224*a*, 224*b* are now considered with reference to support structure 224*a*. In an embodiment, support structure 224*a* may extend on or around a periphery of a membrane portion of the transducer element. A membrane portion of a transducer element may include structures (e.g. including a portion of a piezoelectric element and/or a portion of an adjoining electrode) which are to vibrate during operation of the transducer element—e.g. where such structures are to span a cavity which allows for such vibration. In an embodiment, support structure 224*a* includes one or more interior walls which define at least in part a hole 222*a* extending from a surface of the membrane portion and at least partially through support structure 224*a*. Support structure 224*b* may similarly define a corresponding hole 222*b*. Some or all of a piezoelectric membrane, electrode and/or other structure of the membrane portion may be positioned in hole 222*a* or at an opening of hole 222*a*. Support structures 224*a*, 224*b* may variously provide rigidity to protect such structures—e.g. during subsequent operations to separate such structures from wafer 202 and/or to couple such structures to another wafer, die, substrate or the like. In an embodiment, some portion of support structure 224*a* (or support structure 224*b*) has a cross-sectional profile which is annular or otherwise defines a hole extending through that portion. An example of one such annular-type support structure is illustrated in the detailed view 224*c*.

Referring now to FIG. 2E, a stage 200*e* is shown wherein sacrificial material 230*a*, 230*b* is disposed in holes 222*a*, 222*b* respectively in preparation for subsequent application of a polymer material. Sacrificial material 230*a*, 230*b* may be selectively disposed in respective holes 222*a*, 222*b* with a deposition process such as PECVD through a patterned masked (not shown). In an embodiment, sacrificial material 230*a*, 230*b* may include an oxide (e.g. SiO2) or any of a variety of other materials suitable for subsequent removal—e.g. by an HF vapor etch or other such etch processing. In an alternate embodiment, support structure 224*a* extends at least partially across a membrane structure it is disposed around—e.g. where support structure 224*a* forms an inverted cup structure for improved strength. In such an embodiment, support structure 224*a* may be formed over sacrificial material 230*a*—i.e. after the formation of sacrificial material 230*a*.

Referring now to FIG. 2F, a stage 200*f* is shown wherein a polymer layer 235 is spin coated or otherwise formed over structures shown in stage 200*e*. Polymer layer 235 may have a thickness on the order of 10-50 μm, for example. However, such thickness is merely illustrative of one embodiment, and may vary significantly according to implementation-specific details. In an embodiment, polymer layer 235 includes polymide and/or another polymer material suitable to serve as a dielectric providing flexible support for an array of transducer array elements formed by the processing of FIGS. 2A-2L. Such flexible support may facilitate subsequent removal of such an array from wafer 202—e.g. where polymer layer 235 is to serve as a substrate for the array at least during handling to transfer such an array to an alternate wafer, die or other structure. For example, polymer layer 235 may allow for flexing between transducer elements, while support structures 224*a*, 224*b* provide rigid support for individual transducer elements during such flexing.

Referring now to FIG. 2G, a stage 200*g* is shown wherein one or more vias—e.g. including the illustrative vias 250*a*, 250*b*, 255—may be formed through polymer layer 235 to underlying electrode and/or interconnect structures of the transducer elements. The one or more vias may be formed, for example, by patterning polymer layer 235 with a masked etch and by performing a subsequent plating to variously form conductive paths between a surface of polymer layer 235 and respective electrodes underlying polymer layer 235. For example, vias 250*a*, 250*b* may couple to interconnects 214*a*, 214*b* respectively, to provide communication of drive signals and/or sense signals. Alternatively or in addition, via 255 may couple to top electrode metallization 220 to provide a reference (e.g. ground) potential to one or more transducer elements. Single or multiple layers of electrical interconnect/routing may be built on top of polymer layer 235, according to different embodiments.

Referring now to FIG. 2H, a stage 200*h* is shown wherein access holes 240*a* are etched or otherwise formed through polymer layer 235 to sacrificial material 230*a* in hole 222*a*. Alternatively or in addition, access holes 240*b* may be similarly formed to provide access to sacrificial material 230*b* in hole 222*b*. Access holes 240*a*, 240*b* may provide for a HF vapor etch (or other etch processing) to access and remove sacrificial material 230*a*, 230*b* from respective holes 222*a*, 222*b*. As shown in stage 200*i* of FIG. 2I, such removal of sacrificial material 230*a*, 230*b* may result in the formation of respective cavities 245*a*, 245*b* in holes 222*a*, 222*b*. Subsequently, access holes 240*a*, 240*b* may be at least partially closed—e.g. with additional polymer material—although certain embodiments are not limited in this regard.

Some embodiments further include preparing structures shown in stage 200*i* for subsequent separation from wafer 202. By way of illustration and not limitation, FIG. 2J shows a stage 200*j* wherein a handling layer 265 is adhered or otherwise temporarily bonded to such structures—e.g. via an adhesive layer 260. In an embodiment, adhesive layer 260 includes SU-8, P1, HD-3007 or other such adhesive material which is suitable to form a bond which is readily removable from polymer layer 235 and/or structures formed therein/thereon.

Figure 2K:
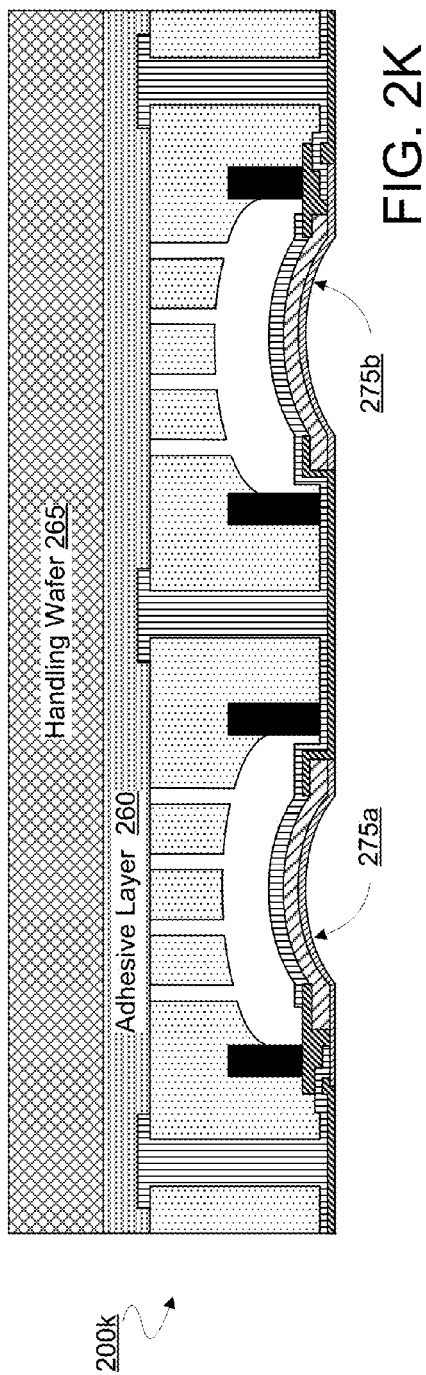
Figure 2K:
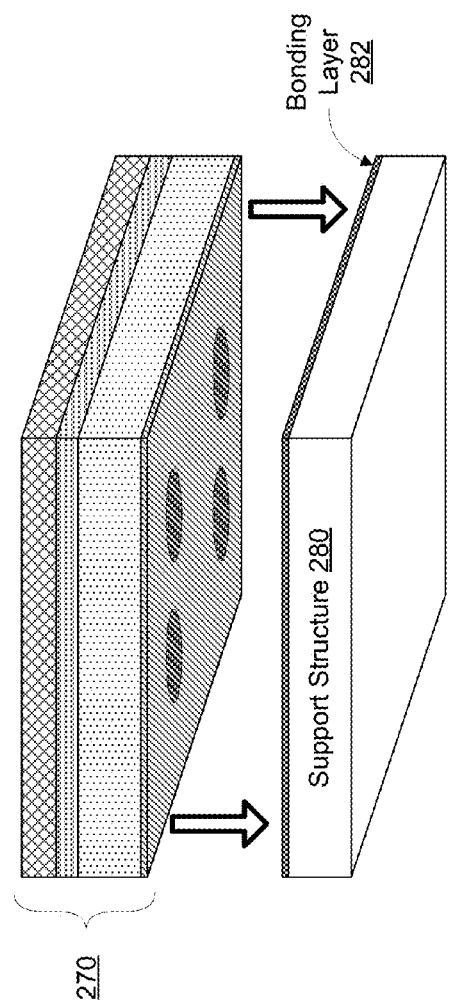

As shown in stage 200*k* of FIG. 2K, respective structures of the transducer elements may then be released from wafer 202 with etching (e.g. including a HF vapor etch), grinding and/or other subtractive processing. Removal of wafer 202 at stage 200*k* may expose an underlying surface including, for example, respective curved surface portions 275*a*, 275*b* of transducer membrane structures.

Although certain embodiments are not limited in this regard, stage 200*k* may further comprise bonding a resulting assembly 270 (e.g. including handling wafer 265, adhesive layer 260, polymer layer 235 and other transducer array structures) to some other wafer, die, substrate or other structure—as represented by the illustrative support structure 280. In an embodiment, assembly 270 is a die which is formed by a cutting of the structures formed on wafer 202—e.g. where such cutting is performed before or after separation of the material of wafer 202 from the transducer structures formed thereon. For example, structures formed on wafer 202 may, prior to bonding with one or more alternate structures, be diced into die-level modules variously comprising a single transducer element, a single row of transducer elements, 2D arrays of transducer elements and/or the like.

Figure 2L:
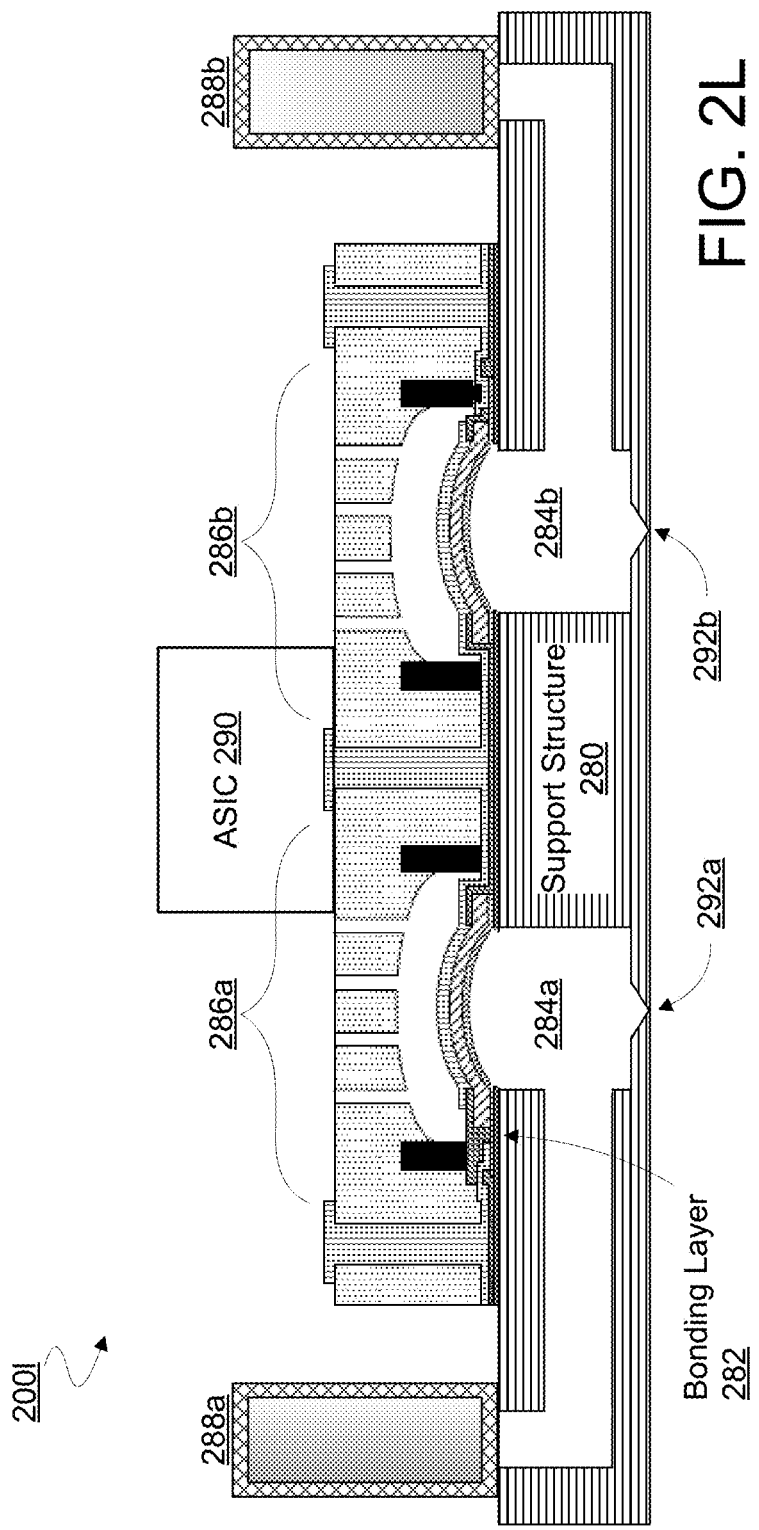

As shown in stage 200*l* of FIG. 2L, support structure 280 (e.g. a wafer, die, injection-molded plastic structure or the like) may be bonded via a bonding layer 282 (e.g. including a permanent adhesive material) to that surface of assembly 270 which is exposed by the removal of wafer 202. Bonding layer 282 may form, for example, a eutectic bond between assembly 270 and support structure 280, although any of a variety of adhesive or other types of bonds may be formed according to different embodiments. Support structure 280 may include recesses which are aligned with curved surface portions 275*a*, 275*b* to form cavities 284*a*, 284*b* with assembly 270. As a result, respective membranes of transducer elements 286*a*, 286*b* may be allowed to vibrate for variously providing drive/sense functionality. In an embodiment, assembly 270 is picked and placed as a die-level modulus on a replacement structure which, for example, may be another MEMS wafer. The resulting structure may be further post-processed—e.g. including attachment of an ASIC 290—if needed.

Stage 200*l* represents one illustrative example according to an embodiment in which support structure 280 is a body of a printhead—e.g. for an inkjet printer. However, support structure 280 may alternatively be any of a variety of other structures formed of plastic, metal, semiconductor, textile, glass and/or other materials, according to different embodiments. Moreover, although transducer elements 286*a*, 286*b* are shown as bonded to a flat surface of support structure 280, certain embodiments are not limited in this regard.

In the illustrated embodiment, support structure 280 includes or is coupled to one or more ink reservoirs—e.g. including the illustrative reservoirs 288*a*, 288*b*—for providing ink to be dispensed with transducer elements 286*a*, 286*b*, respectively. For example, support structure 280 may form a channel between reservoir 288*a* and cavity 284*a*, and another channel between reservoir 288*b* and cavity 284*b*. In such an embodiment, signaling may be provided—e.g. by an ASIC 290 using some or all of vias 250*a*, 250*b*, 255—for operation of the respective membrane structures of transducer elements 286*a*, 286*b* to variously draw ink through such channels and/or to variously output such ink from cavities 284*a*, 284*b* through respective nozzles 292*a*, 292*b*.

Figure 3:
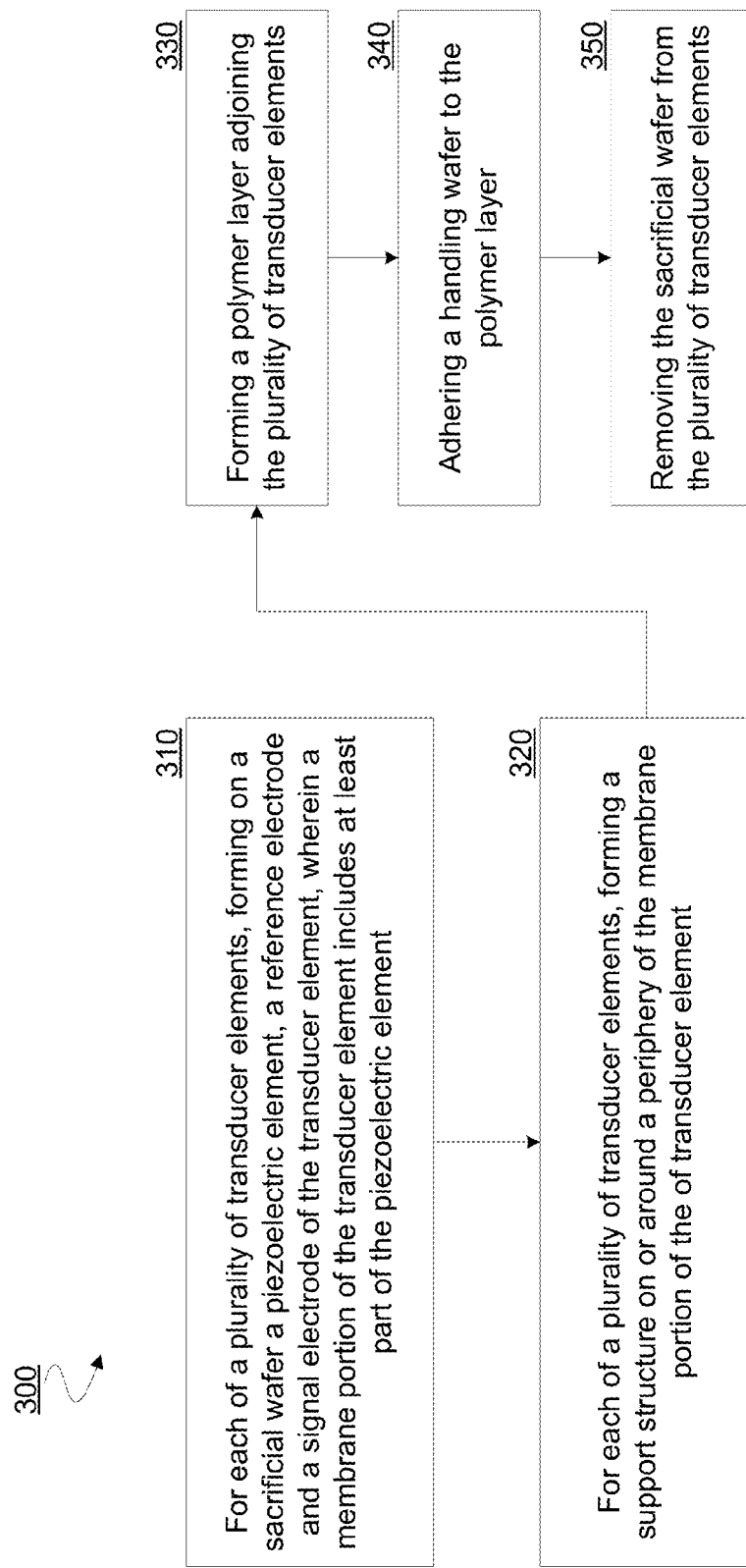
FIG. 3 is a flow diagram illustrating elements of a method to fabricate a transducer array according to an embodiment.

FIG. 3 illustrates elements of a method 300 of fabricating a micromachined transducer array according to an embodiment. Method 300 may include some or all of the features of the fabrication process represented in FIGS. 2A-2L. In an embodiment, performance of method 300 produces one or more arrays such as some or all of transducer array 106, 126, 136.

Method 300 may include operations to form a plurality of transducer elements on a sacrificial wafer. Such operations may include, at 310, for each transducer element of the plurality of transducer elements, forming a piezoelectric element, a reference electrode and a signal electrode of the transducer element. By way of illustration and not limitation, a signal electrode (also referred to as a drive/sense electrode) may include one of bottom electrodes 212*a*, 2121*b*. Alternatively or in addition, a reference electrode may include a portion of top electrode metallization 220 which extends over one of piezoelectric membranes 216*a* and 216*b*. Any of a variety of additional or alternative electrode structures may be formed at 310, according to different embodiments.

A piezoelectric element formed at 310 may be disposed between the reference electrode and the signal electrode of the corresponding transducer element, wherein a membrane portion of the transducer element includes at least part of the piezoelectric element. As used herein, "membrane portion" refers to a portion of a transducer element which is to span one or more cavities which allow for vibration of that membrane portion. For example, a membrane portion of transducer element 286*a* may include respective portions of bottom electrode 212*a*, piezoelectric membrane 216*a* and/or top electrode metallization 220 which span (and, in an embodiment, are to vibrate next to) cavity 245*a* and/or cavity 284*a*.

Formation of the plurality of transducer elements may further comprise—at 320—for each of the plurality of transducer elements, forming a support structure on or around a periphery of the membrane portion of the transducer element. The support structure may define a hole which extends from the membrane portion of the transducer element at least partially through the support structure. For example, a first transducer element may comprise a first support structure, at least part of which has a cross-sectional profile which is annular.

Although certain embodiments are not limited in this regard, method 300 may include additional processing to form the plurality of transducer elements and/or to prepare the plurality of transducer elements for subsequent separation from the sacrificial wafer. By way of illustration and not limitation, method 300 may further comprise, at 330, forming a polymer layer adjoining the plurality of transducer elements. In an embodiment, the polymer layer comprises a polyimide material. Certain embodiments include forming structures extending within or through such a polymer layer. For example, the polymer layer may be etched to form, for each of the plurality of transducer elements, a respective cavity (such as one of cavities 245*a*, 245*b*) adjoining the membrane portion of the transducer element. Alternatively or in addition, a plating may be performed to form vias each extending from a respective electrode of the plurality of transducer elements through the polymer layer.

Method 300 may further comprise, at 340, adhering a handling wafer (such as handling wafer 265) to the polymer layer. Subsequent to the adhering of the handling layer at 340, the sacrificial wafer may, at 350, be removed from the plurality of transducer elements (such as by etching, grinding, polishing and/or the like). Although certain embodiments are not limited in this regard, additional processing (not shown) may include bonding a substrate to the plurality of transducer elements—e.g. wherein the substrate is bonded to a surface of the plurality of transducer elements which is exposed by the removing performed at 350. In an embodiment, such a bonding includes aligning recesses of the substrate each with a respective membrane portion of the plurality of transducer elements.

FIG. 4A illustrates an example of a probe device 400, according to an embodiment, that includes one or more arrays of piezoelectric transducer elements which, for example, each comprise at least a single row of transducer elements. Some or all transducers of such a transducer array may be distributed along a curved surface of the probe device, for example.

As shown in FIG. 4A, probe device 400 may include a main body portion 410 having a distal end 414, where curved sides are formed along the length of main body portion 410. Multiple arrays 412 of transducer elements of probe device 400 may be variously extend along such curved sides of main body portion 410 and, in an embodiment, variously face radially away from main body portion 410. Accordingly, transducer membrane structures of arrays 412 may variously vibrate each in a respective direction which faces away from main body portion 410. Some or all of arrays 412 may be variously fabricated according to techniques having some or all of the features illustrated in FIGS. 2A-2L.

In an embodiment, arrays 412 include one or more two dimensional transducer arrays. Each two-dimensional transducer array may include multiple transducer elements distributed in a curved two-dimensional array. The area covered by the two-dimensional array may be of various shapes, e.g., rectangular, square, circular, octagonal, hexagonal, circular, and so on. The vibrating elements in the two-dimensional array may be distributed on a lattice consisting of lines (e.g., a square lattice or hexagonal lattice) or of more complex patterns. The vibrating surface of the two-dimensional transducer array may be substantially within a plane, although certain embodiments are not limited in this regard.

An operator of the probe device 400 may manipulate main body portion 410 to change the direction and location of the vibrating surface of the sets of transducer arrays 412 as desired. The piezoelectric probe device 400 may optionally include an integrated ASIC wafer (not shown) within main body portion 410 or, alternatively, coupled to main body portion 410. For example, wires 110 connecting to external input connections of such an ASIC may exit from the back end of main body portion 410 and connect to external equipment (e.g., a control device and/or a display device).

In some implementations, some or all transducer elements of arrays 412 each include a membrane structure and a ring-type support structure—e.g. having some or all of the features of support structures 224a, 224b—which is disposed on or around a periphery of the membrane structure. The support structure may provide at least in part for flexible support of that particular transducer element. Alternatively or in addition, such an array may include a layer of polymer material—e.g. including some or all of the features of polymer layer 235—to provide some or all such flexible support. With such structures, flexible support may be provided, for example, during operation for removal of a transducer array from a wafer on which the transducer array is originally formed and/or for bonding of the transducer array to conform to a curved side of main body portion 410.

FIG. 4B illustrates elements of a flexible MEMS device 430 including a pMUT array 434 bonded to a flexible sheet 432 according to an embodiment. Array 434 may include some or all of the features of a transducer array fabricated according to processes such as those represented in FIGS. 2A-2L, for example. In an embodiment, array 434 comprises a plurality of transducer elements, as represented by the illustrative six transducer elements. The transducer elements of array 434 may be distributed in rows and columns, as illustrated by the 3×2 arrangement shown.

Flexible sheet 432 may be comprised of any of a variety of plastic materials adapted from conventional flexible MEMS techniques. A side of array 434 to which flexible sheet 432 is bonded may include respective surfaces of transducer membrane structures. In an embodiment, flexible sheet 432 forms recesses (not shown) which are each aligned with a respective membrane structure to allow for vibration of the membrane structure.

Flexible MEMS device 430 may further comprise input/output (I/O) circuitry 436 to exchange signaling with array 434—e.g. via signal lines 438. I/O circuitry 436 may provide one or more contacts (e.g. pads, balls, pins and/or the like) to provide for coupling of flexible MEMS device 430 to a signal source and/or a signal sink which is to operate with array 434. For example, I/O circuitry 436 may provide for coupling of MEMS device 430 to an ASIC or other device (not shown) which is to exchange drive/sense signals with array 434. Alternatively or in addition, I/O circuitry 436 may include any of a variety of radio frequency (RF) transmission circuits—e.g. such as one adapted from conventional RF-MEMS architectures—to output a RF signal in response to operation of transducer membranes of array 434. In an embodiment, such operation may be in response to a condition—e.g. including vibration, temperature, flexion, pressure and/or the like—experienced by MEMS device 430.

Techniques and architectures for providing a transducer array are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
    a micromachined transducer array including:
        a plurality of transducer elements each comprising:
            a reference electrode;
            a signal electrode;
            a piezoelectric element disposed between the reference electrode and the signal electrode, wherein a membrane portion of the transducer element includes at least part of the piezoelectric element; and
            a support structure disposed on or around a periphery of the membrane portion, the support structure forming a hole extending from the membrane portion at least partially through the support structure; and
        a polymer layer adjoining the plurality of transducer elements, wherein, for each of the plurality of transducer elements:
            the polymer layer forms at least in part a respective cavity adjoining the membrane portion of the transducer element; and
            the support structure of the transducer element extends into the polymer layer.

2. The device of claim 1, wherein the polymer layer comprises polyimide.

3. The device of claim 1, further comprising vias each extending from a respective electrode of the plurality of transducer elements through the polymer layer.

4. The device of claim 1, wherein the plurality of transducer elements includes a first transducer element comprising a first support structure, wherein a cross-sectional profile of the first support structure is annular.

5. The device of claim 1, further comprising a sacrificial wafer coupled to the plurality of transducer elements, wherein a surface of the sacrificial wafer is bonded at the respective membrane portions of the plurality of transducer elements.

6. The device of claim 5, further comprising a handling wafer adhered to the polymer layer.

7. The device of claim 1, the micromachined transducer array further comprising a substrate coupled to the plurality of transducer elements, the substrate including recesses each aligned with a respective membrane portion of the plurality of transducer elements.

8. A system for generating and sensing pressure waves in a medium, the system comprising:
    the device of any of claims 4 through 6;
    generating means coupled to the micromachined transducer array to apply an electrical drive signal on at least one drive/sense electrode;
    receiving means coupled to the micromachined transducer array to receive an electrical response signal from at least one drive/sense electrode; and
    signal processing means coupled to the receiving means to process electrical response signals received from the plurality of the drive/sense electrodes.

9. The system of claim 8, wherein the generating means is to apply an electrical drive signal to cause at least one piezoelectric element of the plurality of transducer elements to resonate at an ultrasonic frequency.

* * * * *